United States Patent [19]

Mayer et al.

[11] 3,760,640

[45] Sept. 25, 1973

[54] UHF TUNER HAVING 70 DETENT POSITIONS WITH FINE TUNING AT ALL POSITIONS

[75] Inventors: Rudolf Mayer, Rottweil; Bernhard Mueller, Hereenzimmern, both of Germany

[73] Assignee: Hopt Electronic GmbH

[22] Filed: June 26, 1972

[21] Appl. No.: 266,324

[52] U.S. Cl. .................................. 74/10.6, 74/10.41
[51] Int. Cl. .................................. F16h 35/18
[58] Field of Search ................ 74/10.29, 10.6, 10.41

[56] References Cited

UNITED STATES PATENTS

| | | | |
|---|---|---|---|
| 1,608,922 | 11/1926 | Bockius | 74/10.6 X |
| 3,353,416 | 11/1967 | Flint et al. | 74/10.6 |
| 3,413,861 | 12/1968 | Moritz et al. | 74/10.6 X |

*Primary Examiner*—Allan D. Herrmann
*Attorney*—Norman J. O'Malley et al.

[57] ABSTRACT

A UHF tuner having 70 detent positions with fine tuning capability at all locations. Coarse tuning is accomplished via a toothed, detented disk and a spirally-extending rim having a follower lever operable therewith. The rim has an oblique flank and axial movement of the rim secures fine tuning.

4 Claims, 2 Drawing Figures

UHF TUNER HAVING 70 DETENT POSITIONS WITH FINE TUNING AT ALL POSITIONS

BACKGROUND OF THE INVENTION

This invention relates to tuning devices for television receivers and more particularly to detent, UHF tuners. It is particularly applicable to variable capacitor tuners.

So-called Memomatic tuners which provide 6, 8, 10, 12 and a maximum of 20 detent positions within the UHF range are already known. These devices are developed as memory mechanisms and permit, with very high mechanical expenditure, in each detent position or coarse tuning setting a selectable fine setting stored with it. Upon each return to this coarse setting, the fine setting value there is automatically scanned and set on the tuning means.

The number of transmitters present in the UHF range and the stations generally received is, however, often greater than the number of detent positions provided. This means that often several stations lie within the same coarse setting and in each case only one station can be stored by the fine tuning setting. This constitutes a considerable disadvantage for the operator. Furthermore, a memory device requires a large number of mechanical parts because of the required reliability of return and it is therefore, expensive.

OBJECTS AND SUMMARY OF THE INVENTION

It is, therefore, an object of this invention to obviate the disadvantages of the prior art.

It is another object of this invention to provide a tuner that is simple and economical to fabricate.

Yet another object of the invention is the provision of a tuner that is detent tunable over the entire UHF range.

These objects are accomplished in one aspect of the invention in the provision of a tuner which has the coarse tuning connected with a toothed detent disk which cooperates, by means of the teeth, with a detent device. The disk has a spirally extending rim with an oblique flank attached to the bottom thereof. The oblique flank is contacted by one end of a follower lever. The other end of the lever is connected to a shaft which controls the tuning elements. The fine tuning control is operable to displace the rim axially and thereby move the follower lever in very small increments to accomplish fine tuning.

The range of swing of the follower lever necessary for tuning over the UHF range for a given tuning means, such as a variable capacitor, is brought about by developing the spiral over 1, 1½, of 2 turns. The development of the incline of the oblique flank of the spiral rim and therefore the angle of rim is in a very specific relationship to the number of detent positions and the angular extent of the spiral rim. The ratio selected must be so large that by means of the fine tuning adjustment, at least the frequency range from detent position to detent position can be encompassed. A slight overlap is usually advisable.

DESCRIPTION OF THE PREFERRED EMBODIMENTS

For a better understanding of the present invention, together with other and further objects, advantages and capabilities thereof, reference is made to the following disclosure and appended claims in connection with the above-described drawings.

Figure 1:
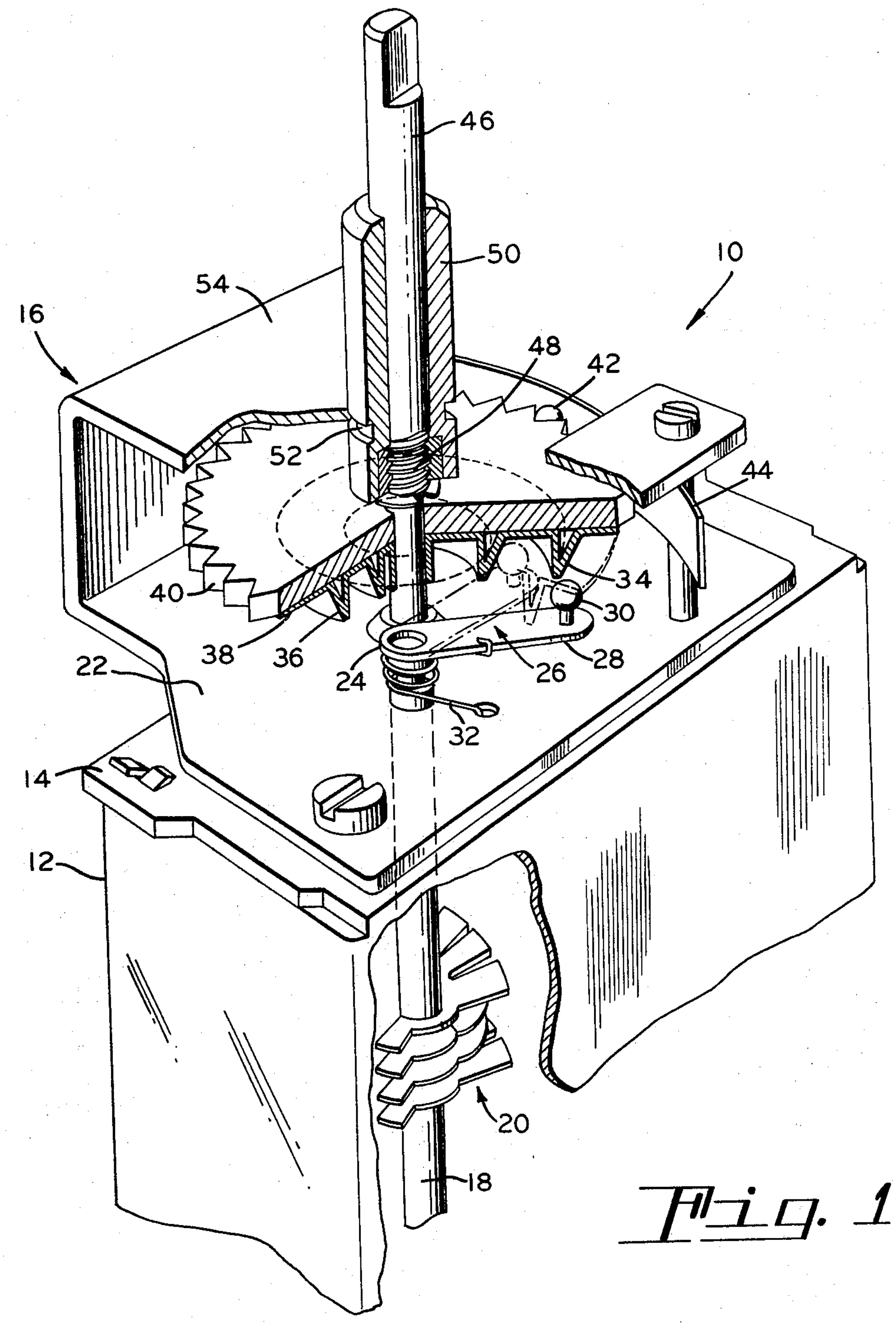
FIG. 1 is a perspective view of the device partially in section and broken away.

Referring now to the drawings with greater particularity, there is shown in FIG. 1 a tuner 10 having a housing 12. Attached to the front 14 of housing 12 is a "U" shaped bracket 16. A shaft 18 which is connected to the tuning means 20 extends through the front 14 and a wall 22 of bracket 16. In this particular instance the tuning means 20 is shown as being a 60° variable capacitor. One end 24 of a follower lever 26 is fastened to shaft 18 while its other end 28 carries a follower ball 30. A tension spring 32 maintains the follower ball 30 against the oblique flank 34 of the spiral rim 36 of the disk 38. In the embodiment shown the disk 38 has a spiral rim which extends over two revolutions.

The disk 38 is rigidly connected with a toothed detent disk 40, which in the embodiment shown is provided with 35 teeth which cooperate with a detent ball 42 and a detent spring 44. The detent ball 42 and spring 44 are suitably mounted upon housing 12. The detent disk 40 is driven by a coarse tuning shaft 46. The coarse tuning shaft 46 is connected, via threads 48, with a coaxial shaft 50 for deriving fine tuning. The fine tuning shaft 50 has a groove 52 for positioning the shaft 50 without axial play in a wall 54 of bracket 16.

Figure 2:
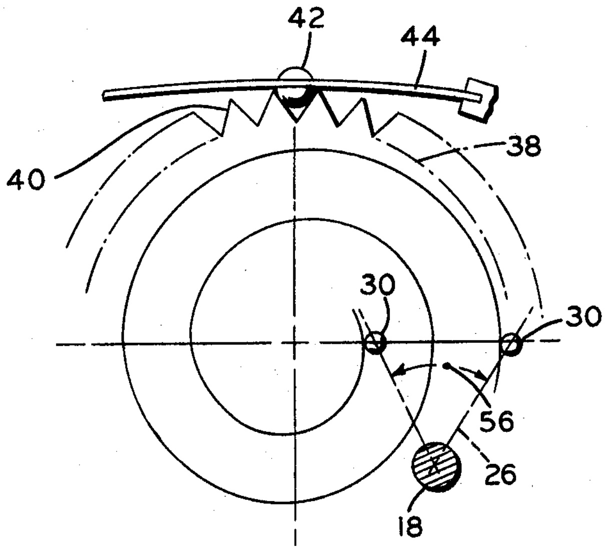
FIG. 2 is a schematic drawing of the tuning range.

The tuning device in the example shown permits coarse tuning over two revolutions (because of the development of the spiral rim 36) and, therefore, two times 35 detent positions. In this regard the lever 26 is swung, by follow-up movement, a maximum of 60° along the oblique flank 34 of the spiral rim 36 and turns the shaft 18 and the tuning means 20 from stop to stop. This is shown schematically in FIG. 2 which shows the angle 56 which the lever 26 can describe between the two extreme positions of the follower ball 30. In each detent position a fine adjustment is possible in the manner that the fine tuning shaft 50 is rotated and as a result thereof the coarse tuning shaft 46, including the detent disk 40 and the disk 38 is displaced axially. Since follower ball 30 rests against the oblique flank 34, the lever 26 is swung slightly. The change in capacitance obtainable thereby must, by corresponding development of the angle of the oblique flank 34, give at least the same change in capacitance as turning the coarse tuning shaft 46 to an adjacent detent position.

The precision of the fine tuning is improved if the angle of oblique flank 34 is made steeper and/or the threads 48 between the coarse and fine tuning are made finer.

Insofar as the UHF range is 420 megacycles and the distance required to be maintained between transmitters is 6 megacycles, there then result in accordance with the example given, 70 detent positions which, even with the coarse tuning, approximately tune the stations. There could then be obtained a distorted picture of the desired, which station can be accurately tuned in by the fine tuning. As fine tuning one can, of course, also or additionally use an electronic system (AFC).

Without departing from the inventive concept, the solution described with the use of a variable capacitor as the tuning means can be employed just as advantageously for the actuation of other known tuning means such as potentiometers, capacitance diodes (varactors) or inductive tuning means.

While there have been shown what are at present considered to be the preferred embodiments of the invention, it will be obvious to those skilled in the art that various changes and modifications may be made therein without departing from the scope of the invention as defined by the appended claims.

What is claimed is:

1. A tuning device for a UHF tuner for a television receiver, said device providing both coarse and fine tuning in a detented manner and comprising: a housing containing a variable tuning means having a shaft which extends from said housing, the projecting end of said shaft having a follower lever attached thereto and extending therefrom; a coarse tuning control having a rotatable shaft operatively mounted with said housing and being axially displaced from and substantially parallel to said tuning means shaft, one end of said coarse tuning shaft being provided with an operator control and the other end being provided with a toothed detent disk; a detent device mounted upon said housing and cooperating with said disk comprising a spring-loaded ball for engaging the teeth of said disk; a spirally-extending rim having an oblique flank positioned on the surface of said disk remote from said operator control, said follower lever being in contact with said rim with said contact being maintained by spring tension; and a fine tuning control operable to displace said coarse tuning control in an axial direction.

2. The device of claim 1 in which said coarse tuning control and said fine tuning control are coaxial.

3. The device of claim 2 wherein said fine tuning control is mounted with said housing free of play and said coarse tuning and fine tuning are interconnected via a thread.

4. The device of claim 3 wherein the development of the incline of said oblique flank is such that the maximum change obtainable by fine tuning corresponds at least to the change in coarse tuning engendered between adjacent detent positions of the coarse tuning.

* * * * *

PO-1050
(5/69)

UNITED STATES PATENT OFFICE
CERTIFICATE OF CORRECTION

Patent No. 3,760,640 Dated September 25, 1973

Inventor(s) Rudolf Mayer and Bernhardt Mueller

It is certified that error appears in the above-identified patent and that said Letters Patent are hereby corrected as shown below:

In the headnotes on the title page, after .."[21] Appl. No. 266,324"... insert ..... [30] Foreign Application Priority Data July 13, 1971 Germany.......P 21 34 844.7...

Signed and sealed this 16th day of July 1974.

(SEAL)
Attest:

McCOY M. GIBSON, JR.
Attesting Officer

C. MARSHALL DANN
Commissioner of Patents